(12) United States Patent
Yamaji

(10) Patent No.: US 6,751,080 B2
(45) Date of Patent: Jun. 15, 2004

(54) CONTROL CIRCUIT FOR SEMICONDUCTOR DEVICE WITH OVERHEAT PROTECTING FUNCTION

(75) Inventor: Shigeo Yamaji, Aichi (JP)

(73) Assignee: Yazaki Corporation, Tokyo (JP)

( * ) Notice: Subject to any disclaimer, the term of this patent is extended or adjusted under 35 U.S.C. 154(b) by 211 days.

(21) Appl. No.: 09/730,588

(22) Filed: Dec. 7, 2000

(65) Prior Publication Data

US 2001/0038518 A1 Nov. 8, 2001

(30) Foreign Application Priority Data

Dec. 8, 1999 (JP) .......................................... 11-348500

(51) Int. Cl.[7] ................................................. H02H 3/00
(52) U.S. Cl. ....................................... 361/93.8; 361/103
(58) Field of Search ................................. 361/93.8, 113, 361/58, 76, 106, 103

(56) References Cited

U.S. PATENT DOCUMENTS 5,642,252 A * 6/1997 Sakamoto et al. .......... 361/103

5,943,203 A * 8/1999 Wang .......................... 361/75

OTHER PUBLICATIONS

"Modern Control Systems" Bishop, Dorf 7th edition. pp. 10 and 714.*

* cited by examiner

Primary Examiner—Boris Benenson
(74) Attorney, Agent, or Firm—Armstrong, Kratz, Quintos, Hanson & Brooks, LLP

(57) ABSTRACT

A control circuit for a semiconductor device with overheat protecting function is provided, which includes: a semiconductor element; an overheat protecting means; a chip to mount the semiconductor element and the overheat protecting means; a control means to supply a pulse-width modulation control signal having a fixed pulse width to the semiconductor element; and an outputting state detecting means to detect abnormality of output of the semiconductor device with overheat protecting function during an overheat protective operation of the overheat protecting means, wherein the control means monitors detection output from the outputting state detecting means at a fixed monitoring timing and stops supplying the pulse-width modulation control signal to the semiconductor element when the detection output is generated successively predetermined times or successively during predetermined time.

2 Claims, 4 Drawing Sheets

CONTROL CIRCUIT FOR SEMICONDUCTOR DEVICE WITH OVERHEAT PROTECTING FUNCTION

BACKGROUND OF THE INVENTION

1. Field of the Invention

The present invention relates to a control circuit for a semiconductor device with overheat protecting function.

2. Description of the Related Art

FIG. 3 is a circuit diagram showing a prior art control circuit for a semiconductor device with overheat protecting function.

The control circuit consists of a microcomputer 1, an amplifying circuit 2, a semiconductor device 3 with overheat protecting function, and a load 4.

The microcomputer 1 generates therein a control signal, for example a pulse-width modulation control signal (hereinafter, PWM control signal), to carry out control of the semiconductor device 3 with overheat protecting function, or receives it from a non-shown external signal source, and then output it from an output port P1.

The amplifying circuit 2 a push-pull type amplifying circuit consisting of transistors 21, 22, 23, 24 and resistances 25, 26, 27, 28, 29, 30, 31, 32.

The semiconductor device 3 with overheat protecting function is of a MOSFET (i.e. metal oxide semiconductor field-effect transistor) with overheat protecting function, and consists of a MOSFET 33, a gate resistance 34 connected between a gate of the MOSFET 33 and a gate terminal G, a temperature detecting circuit 35 connected between a source terminal S and a source of the MOSFET 33, a latch circuit 36 to latch a temperature-detection output of the temperature detecting circuit 35, and a gate breaking circuit 37 to be controlled with an output of the latch circuit 36 connected between the gate and source of the MOSFET 33, which all are mounted on a chip. A drain of the MOSFET 33 is connected to a drain terminal D connected to a "+B" power source, and the source is connected to the source terminal S.

An overheat protecting function of the semiconductor device 3 is carried out by the gate resistance 34, the temperature detecting circuit 35, the latch circuit 36 and the gate breaking circuit 37.

The load 4 is, for example, a lamp in use for a blinker of a vehicle.

In the above-described structure, the PWM control signal is output from the output port P1 of the microcomputer 1, is amplified by the amplifying circuit 2, and is supplied to the gate terminal G of the semiconductor device 3 with overheat protecting function through the resistance 32.

In a normal operation state, the MOSFET 33 gets ON/OFF by the PWM signal supplied to the gate terminal G, and an amplified PWM control signal arises on the source and is supplied to the load 4 through the source terminal S. The load 4 is driven by the supplied PWM control signal.

On the other hand, when an abnormality such as the short of the load 4 arises a large current flows between the source and the drain of the MOSFET 33 due to the PWM control signal coming after that occurrence in the first place, whereby temperature of the chip rises. The rise in temperature of the chip is detected by the temperature detecting circuit 35, and the detection output is supplied to the latch circuit 36. Subsequently, the output of the latch circuit 36 is supplied to the gate breaking circuit 37. The gate breaking circuit 37 is controlled by the output of the latch circuit 36 so as to protectively intercept a gate input of the MOSFET 33.

Accordingly, the large current to the MOSFET 33 stops, and temperature of the chip drops.

After the above protective operation, the control of the latch circuit 36 and the gate breaking circuit 37 are released with the rise voltage of the PWM control signal coming next, whereby the large current flows between the source and the drain of the MOSFET 33 again and temperature of the chip rises again. The rise in temperature of the chip is detected by the temperature detecting circuit 35, and the latch circuit 36 and the gate breaking circuit 37 protectively operate with the detection output. The protective operation is carried out like above every time the PWM control signal rises.

As a result, as is shown in FIG. 4, when the start time of the gate voltage of the MOSFET 33 by the PWM control signal supplied from the microcomputer 1 through the amplifying circuit 2 is designated as Tg(on) and the fall time of the gate voltage is designated as Tg(off), the source voltage waveform is the same as the gate voltage waveform in the normal operation.

With respect to the above prior art, however, when the short in the load 4 arises, the pulse width of the source voltage waveform gradually becomes short every time the protective operation occures.

And, since the overheat protecting function has limitation in frequency structurally, the MOSFET could be broken in several seconds to several minutes in case the short in the load 4 has occurred in a state that the PWM control signal is applied.

SUMMARY OF THE INVENTION

In view of the foregoing, an object of the present invention is to provide a control circuit for a semiconductor device with overheat protecting function wherein the risk of breakage of the semiconductor device can be reduced.

In order to achieve the above object, as a first aspect of the present invention, a control circuit for a semiconductor device with overheat protecting function comprises: a semiconductor element; an overheat protecting means; a chip to mount the semiconductor element and the overheat protecting means; a control means to supply a pulse-width modulation control signal having a fixed pulse width to the semiconductor element; and an outputting state detecting means to detect abnormality of output of the semiconductor device with overheat protecting function during an overheat protective operation of the overheat protecting means, wherein the control means monitors detection output from the outputting state detecting means at a fixed monitoring timing and stops supplying the pulse-width modulation control signal to the semiconductor element when the detection output is generated successively predetermined times or successively during predetermined time.

As a second aspect of the present invention, in the structure with the above first aspect, the semiconductor element is of a MOSFET, and the overheat protecting means includes a temperature detecting circuit, a latch circuit, and a gate breaking circuit.

As a third aspect of the present invention, in the structure with either of the above first or second aspect, the control means monitors the detection output from the outputting state detecting means at each monitoring timing of the pulse-width modulation control signal's start time plus a fixed time period being shorter than the fixed pulse width.

According to the above-described structures of the present invention, the following advantages are provided.

(1) Since the operation state of the semiconductor device with overheat protecting function is detected, the risk of the breakage of the semiconductor device can be greatly reduced. And, in case that the semiconductor device with overheat protecting function is used for driving a lamp of a vehicle, occurrence of the fire in the vehicle can be prevented.
(2) The risk of the breakage of the MOSFET can be greatly reduced.
(3) The monitoring timing can be suitably set.

The above and other objects and features of the present invention will become more apparent from the following description taken in conjunction with the accompanying drawings.

DESCRIPTION OF THE PREFERRED EMBODIMENT(S)

An embodiment of the present invention will now be described in further detail with reference to the accompanying drawings.

Figure 1:
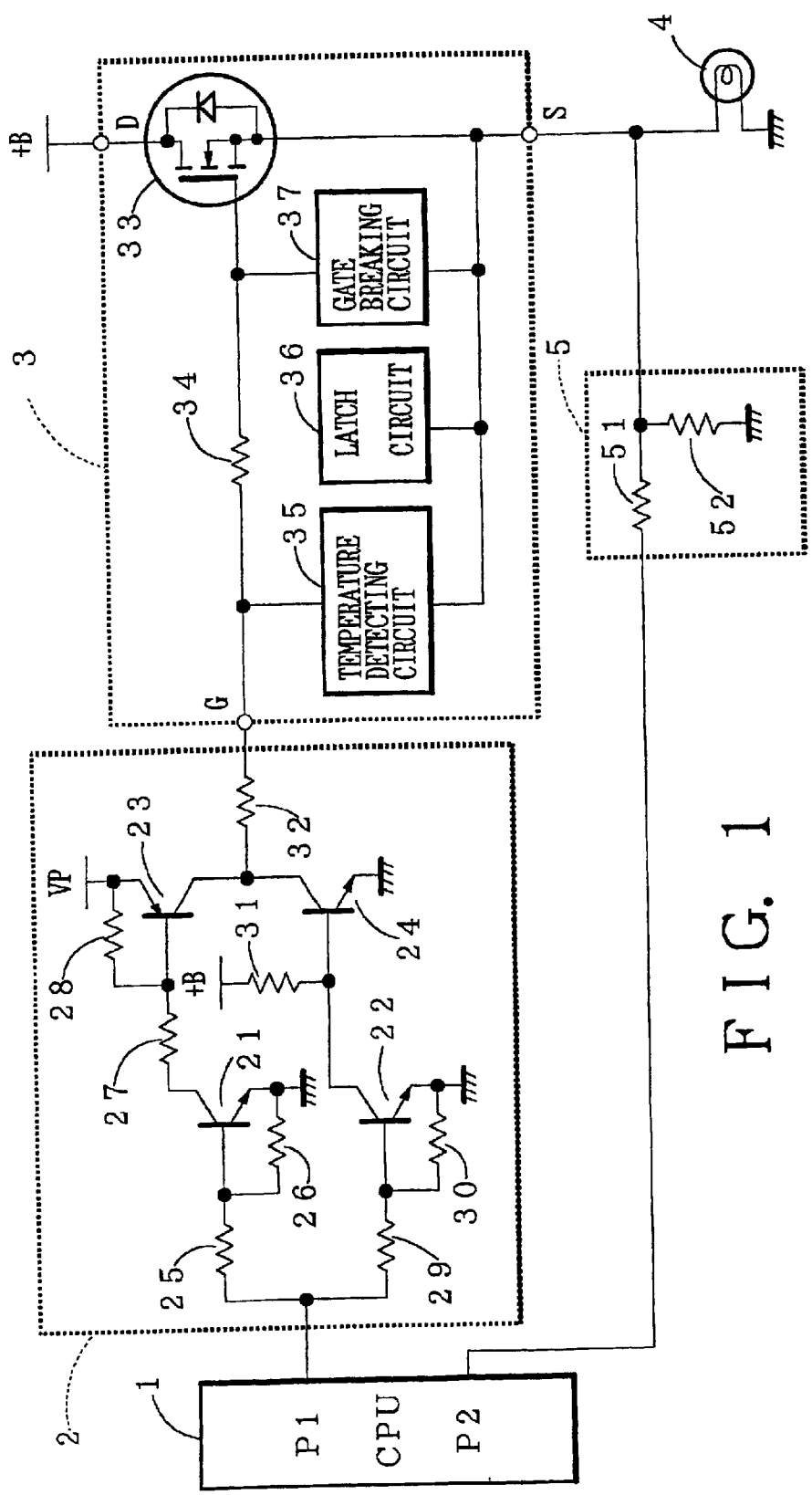
FIG. 1 is a circuit diagram showing an embodiment of a control circuit for a semiconductor device with overheat protecting function in accordance with the present invention.
Figure 3:
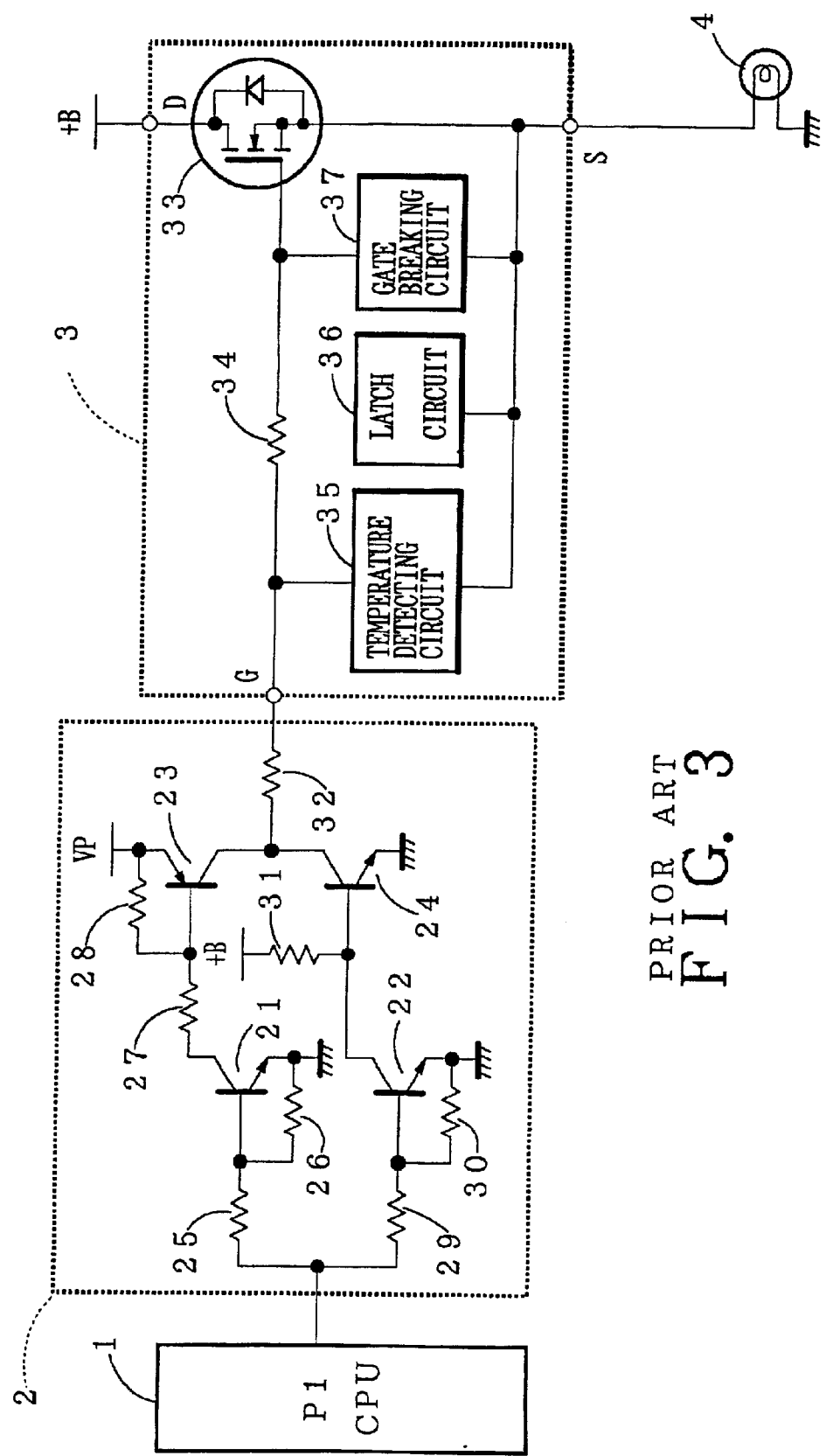
FIG. 3 is a circuit diagram showing a prior art control circuit for a semiconductor device with overheat protecting function.
Figure 4:
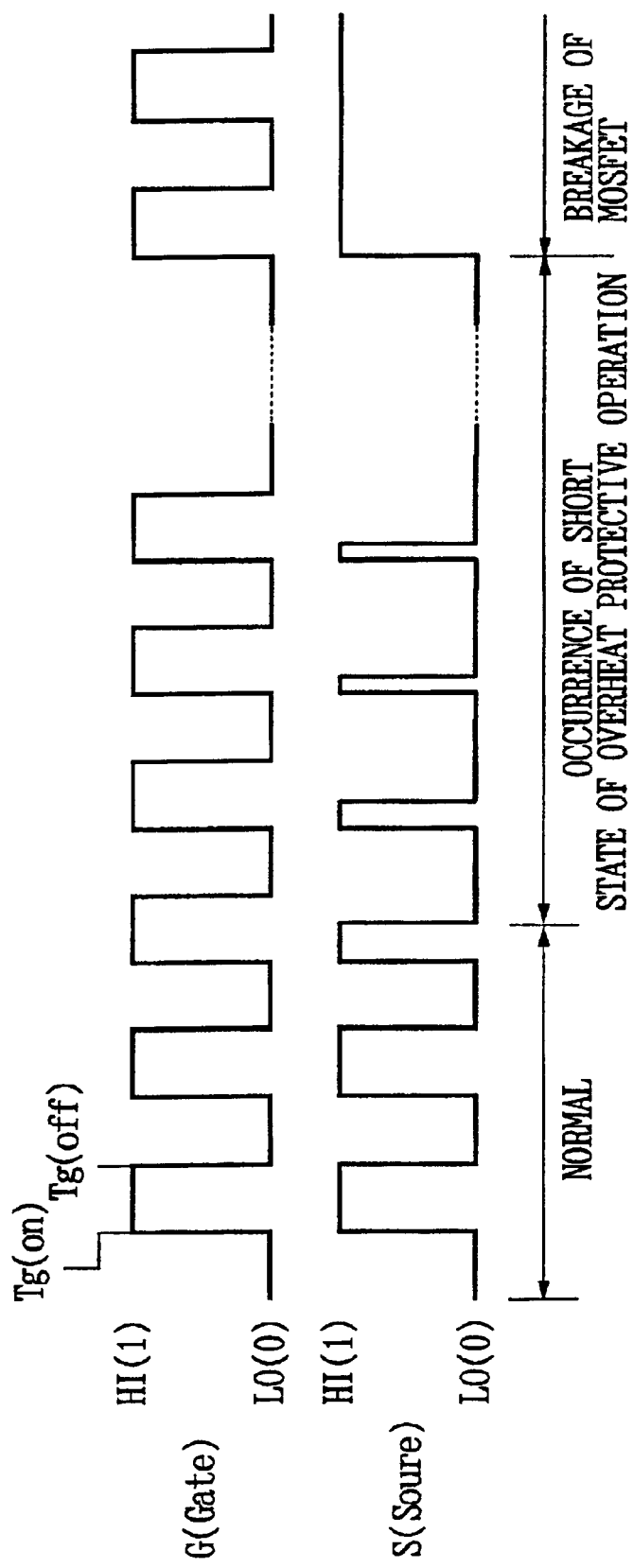
FIG. 4 is a timing chart showing operation of the control circuit of FIG. 3.

Referring to FIG. 1, a control circuit of FIG. 1 is characterized, in addition to the control circuit of FIG. 3, in that an outputting state detecting portion 5 as an outputting state detecting means is provided and a detection output thereof is supplied to an input port P2 of a microcomputer 1 as a control means. The outputting state detecting portion 5 consists of a resistance 51 connected between a source terminal of the semiconductor device 3 with overheat protecting function and an input port P2 of the microcomputer 1 and a resistance 52 connected between the source terminal of the semiconductor device 3 with overheat protecting function and the ground.

And, in the control circuit of FIG. 1, the output voltage, namely the source voltage, of the MOSFET 33 is detected by the outputting state detecting portion 5 at every fixed monitoring timing, i.e., Tg(on) (i.e. the start time of the gate voltage of the MOSFET 33)+Ts(i.e. fixed time period), and the microcomputer 1 judges whether or not the overheat protecting fiction is operating, based on whether the output state is in high level (HI) or in low level (LO).

Here, Ts<Tg(off)−Tg(on),
where, Tg(off); the end time of the gate voltage of the MOSFET 33, and
Tg(off)−Tg(on); pulse width of the PWM control signal itself The fixed time period Ts is preferably set as close as "Tg(off)−Tg(on)".

Hereinafter, the operation will be described in detail.

The PWM control signal having been output from the output port P1 of the microcomputer 1 is amplified by the amplifying circuit 2 and is supplied to the gate of the MOSFET 33. While the PWM control is carried out, the microcomputer 1 detects the output voltage of the MOSFET 33, namely the source voltage, by means of the outputting state detecting portion 5 at every monitoring timing of "start time Tg(on)+fixed time period Ts".

Figure 2:
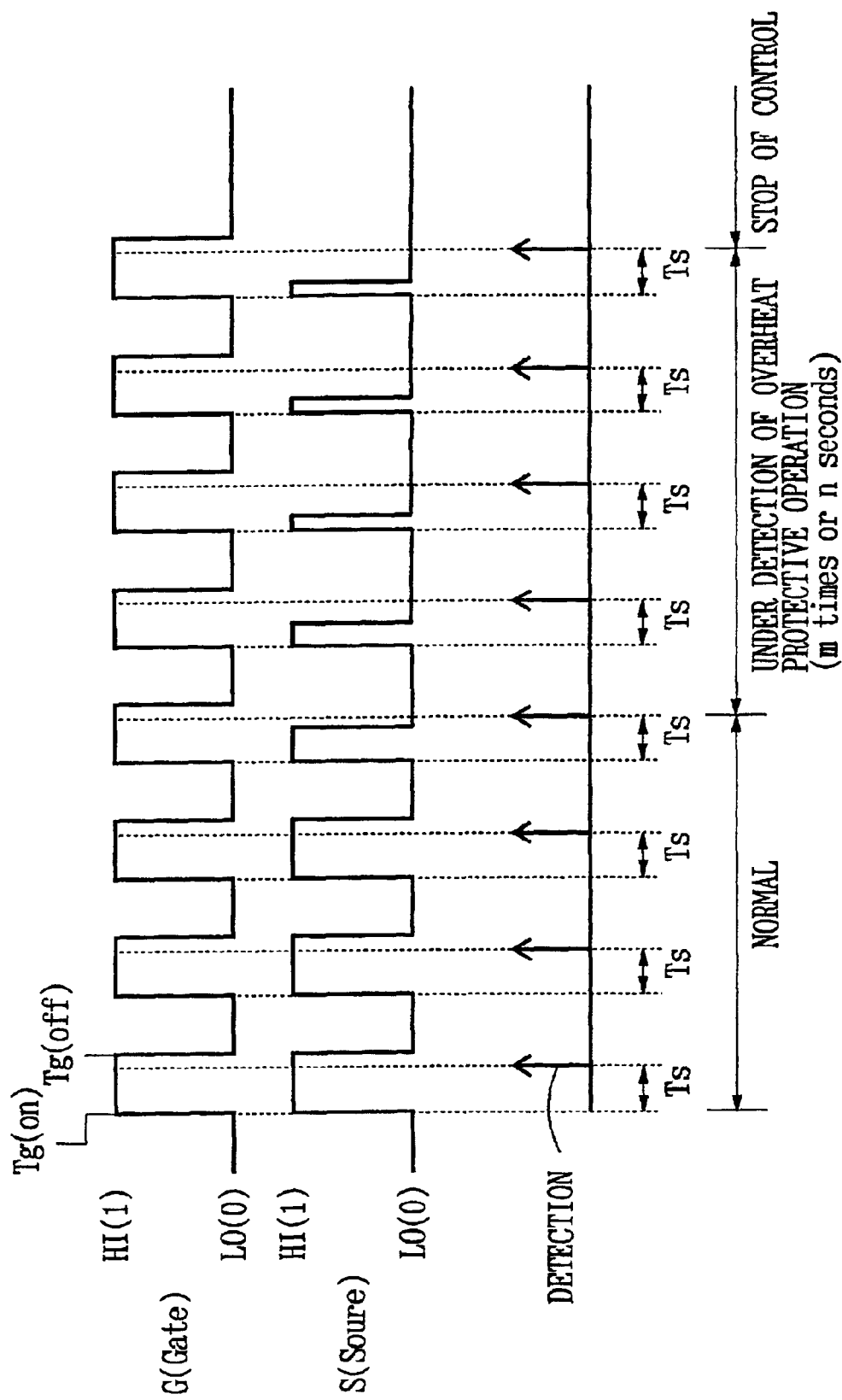
FIG. 2 is a timing chart showing operation of the control circuit of FIG. 1.

As shown in FIG. 2, if the state of the load 4 is normal, the source voltage stands up at each start time Tg(on) of the gate voltage of the MOSFET 33, falls down at each fall time Tg(off), and becomes the same waveform as the gate voltage. Accordingly, when the source output state is detected by the microcomputer 1 based on the detection output from the outputting state detecting portion 5 at each monitoring timing of "Tg(on)+Ts", the source voltage gets HI (i.e. logic "1").

On the other hand, when an abnormality such as the short arises on the load 4 and then the MOSFET 33 is intercepted by the overheat protecting means of the temperature detecting circuit 35, the latch circuit 36, and the gate breaking circuit 37, the source voltage of the MOSFET 33 gets waveforms wherein the pulse width gradually shortens at each protective operation, as shown in FIG. 2. Accordingly, when the source output state is detected by the microcomputer 1 based on the detection output from the outputting state detecting portion 5 at each monitoring timing of "Tg(on)+Ts", the source voltage gets LO (i.e. logic "0").

And, when the microcomputer 1 has detected a state that the source output state is LO (logic "0") successively m times or during n seconds, the PWM control signal is not given to the output port P1 and the PWM control of the MOSFET 33 stops. The above "m times or during n seconds" is set in order to securely prevent breakage of the MOSFET 33.

As a result, the current does not flow between the drain and the source of the MOSFET 33, thereby preventing breakage of the MOSFET 33 due to the temperature rise.

And, as above, the microcomputer 1 can detect the operation state of the semiconductor device with overheat protecting function by means of comparing HI and LO (logic "1" and "0") of the PWM control signal with HI and LO (logic "1" and "0") of the source output state.

That is, if the PWM control signal is "0" and the source output state is "0" or if the PWM control signal is "1" and the source output state is "1", the microcomputer 1 judges the semiconductor device to be in a normal operation state. And, if the PWM control signal is "0" and the source output state is "1", the microcomputer 1 judges the MOSFET 33 to be in a broken state. Further, if the PWM control signal is "1" and the source output state is "0", the microcomputer 1 judges that the overheat protecting function is under operation.

Like the above, since the operation state of the semiconductor device with overheat protecting function is detected, the risk of the breakage of the MOSFET 33 can be greatly reduced. Accordingly, in case that the semiconductor device 3 with overheat protecting function is used for driving a lamp of a vehicle, occurrence of the fire in the vehicle can be prevented.

Otherwise, for example, the microcomputer 1 can detect a state of the MOSFET 33 (i.e. a breakage or the overheat protective operation) if the source output state is periodically monitored, even in control with other control signal than the PWM control signal.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A control circuit for a semiconductor device with overheat protecting function, comprising:

a semiconductor element;

an overheat protecting means;

a chip to mount the semiconductor element and the overheat protecting means;

a control means to supply a pulse-width modulation control signal having a fixed pulse width to the semiconductor element; and an outputting state detecting means to detect abnormality of output of the semiconductor device with overheat protecting function during an overheat protective operation of the overheat protecting means, wherein the control means monitors detection output from the outputting state detecting means at each monitoring timing of the pulse-width modulation control signal's start time plus a fixed time period which is shorter than the fixed pulse width, wherein the control means stops supplying the pulse-width modulation control signal to the semiconductor element when the detection output is generated successively predetermined times or successively during predetermined time, and wherein the overheat protection means outputs a source voltage having a pulse width shorter then the fixed pulse width of the pulse-width modulation control signal supplied from the control means during the overheat protective operation so that the outputting state detection means can detect the abnormally of output of the semiconductor device.

2. The control circuit for a semiconductor device with overheat protecting function as set forth in claim 1, wherein the semiconductor element is of a MOSFET, and the overheat protecting means includes a temperature detecting circuit, a latch circuit, and a gate breaking circuit.

* * * * *